United States Patent
Dimitrov (10) Patent No.: US 7,947,941 B2
(45) Date of Patent: May 24, 2011

(54) PHOTODIODE HAVING ROUNDED EDGES FOR HIGH ELECTROSTATIC DISCHARGE THRESHOLD

(75) Inventor: Roman Dimitrov, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 159 days.

(21) Appl. No.: 11/932,369

(22) Filed: Oct. 31, 2007

(65) Prior Publication Data

US 2008/0210845 A1 Sep. 4, 2008

Related U.S. Application Data

(60) Provisional application No. 60/863,936, filed on Nov. 1, 2006.

(51) Int. Cl.
*H01L 31/00* (2006.01)

(52) U.S. Cl. ............... 250/214.1; 250/239; 257/457; 257/458

(58) Field of Classification Search ............... 250/200, 250/214.1, 239; 257/457, 458
See application file for complete search history.

(56) References Cited

U.S. PATENT DOCUMENTS

| | | | | |
|---|---|---|---|---|
| 5,710,442 | A * | 1/1998 | Watanabe et al. | 257/107 |
| 5,883,988 | A * | 3/1999 | Yamamoto et al. | 385/14 |
| 6,281,561 | B1 * | 8/2001 | Stiebig et al. | 257/440 |
| 6,630,402 | B2 * | 10/2003 | Hshieh et al. | 438/692 |
| 2002/0140004 | A1 * | 10/2002 | Tian et al. | 257/233 |
| 2003/0213984 | A1 * | 11/2003 | Berezin et al. | 257/232 |
| 2006/0071229 | A1 * | 4/2006 | Guenter | 257/99 |
| 2007/0023799 | A1 * | 2/2007 | Boettiger | 257/292 |

OTHER PUBLICATIONS

Author Unknown, "What Are Optical Chips," http://orca.st.usm.edu/~jsanchez/whatare.htm, Printed Sep. 6, 2006, pp. 1-4.
Author Unknown, "InP-based low dark-current 1.55um photodiodes," http://www.nanotechnology.bilkent.edu.tr/research%20areas/documents/InP_based.html, Printed Sep. 6, 2006, pp. 1-2.
Author Unknown, "A Prime on Photodiode Technology," http://home.sandiego.edu/~ekim/photodiode/pdtech.html, Printed Sep. 6, 2006, pp. 1-15.
Author Unknown, "Structure and technology of the PIN SiGe photodetector," Materials Science and Engineering B89 (2002), p. 77.
Chiu et al., "Ultrafast (370 GHz bandwidth) p-i-n traveling wave photodetector using low-temperature-grown GaAs," Appl. Phys. Lett. 71, (17), Oct. 27, 1997, pp. 2508-2510.
Lin et al., "Demonstration of a Novel On-fiber Photodetector for On-line Power Monitoring and All-fiber Spectrometer Applications," University Paper, Dept. of EECS, Henry Samueli School of Engineering, University of California, Irvine CA (Dec. 15-19, 2003).

* cited by examiner

*Primary Examiner* — Georgia Y Epps
*Assistant Examiner* — Kevin Wyatt
(74) *Attorney, Agent, or Firm* — Maschoff Gilmore & Israelsen (57) ABSTRACT

In one example, an optical detector includes a photosensitive layer, and a group of additional layers associated with that photosensitive layer. The group of additional layers may include first and second contact layer configured for electrical communication with the photosensitive layer. In this example, one of the group of layers is shaped so as to define a corner whose radius of curvature is greater than about 2 microns.

15 Claims, 5 Drawing Sheets

PHOTODIODE HAVING ROUNDED EDGES FOR HIGH ELECTROSTATIC DISCHARGE THRESHOLD

RELATED APPLICATION

This application claims the benefit of, and priority to, U.S. Provisional Patent Application Ser. No. 60/863,936, entitled PHOTODIODE HAVING ROUNDED EDGES FOR HIGH ELECTROSTATIC DISCHARGE THRESHOLD, filed Nov. 1, 2006, and incorporated herein in its entirety by this reference.

BACKGROUND OF THE INVENTION

Photodetector devices are commonly employed for converting optical signals to electrical signals in a variety of applications. Such photodetectors are used, for instance, in connection with optical transmitters to monitor the output power of an optical signal produced by the optical transmitter, and as optical receivers to convert an incoming optical signal into an electrical signal.

As an optoelectronic device, photodetectors are susceptible to damage resulting from electrostatic discharge ("ESD") that may occur when a high potential difference is applied across the contacts of the device. At the same time, there is an interest in maximizing the amount of sensitive surface area on photodetectors. Unfortunately, some approaches to ESD risk reduction in photodetectors often result in a corresponding reduction of the overall sensitive surface area of the device.

BRIEF DESCRIPTION OF THE DRAWINGS

To further clarify various aspects of embodiments of the present invention, a more particular description of the invention will be rendered by reference to specific embodiments, aspects of which are disclosed in the appended drawings. It is appreciated that these drawings depict only example embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It should be understood that the drawings are diagrammatic and schematic representations of exemplary embodiments of the invention, and are not limiting of the present invention, nor are the drawings necessarily drawn to scale.

I. General Aspects of Some Optical Detectors

In general, the example embodiments of this disclosure are concerned with optoelectronic transducers implemented so as to facilitate a relative reduction in the likelihood that a damaging electrostatic discharge ("ESD") will be experienced. More particularly, the disclosed example embodiments are configured such that they define optical detector surfaces and/or surface intersections in such a way as to aid in the control of electric field buildup, thereby reducing the likelihood of the incidence of ESD, or in other words, increasing the ESD threshold of the device.

It should be noted that, as contemplated herein, the term 'optoelectronic transducers' is intended to broadly embrace any device capable of converting an optical signal to an electrical signal. Devices with this capability are sometimes referred to as being photosensitive. Consistent with the foregoing, optoelectronic transducers embrace, among other things, optical detectors such as monitor photodiodes ("MPD") used to monitor optical signal strength of an optical transmitter, and optical receivers used to convert optical data signals to electrical data signals. Both MPDs and optical receivers may be employed in optical communication systems, devices and networks. Note that optical detectors may alternatively be referred to as 'photodetectors.' Some examples of such optical communication systems, devices and networks include, but are not limited to, optical subassemblies ("OSA"s), such as receiver optical subassemblies ("ROSA") and transmitter optical subassemblies ("TOSA"), as well as various types of modules such as transmitter modules, receiver modules, transceiver modules, and transponder modules.

As indicated herein, examples of the disclosed optoelectronic transducers may be employed in connection with optical communication networks. The scope of the invention is not limited to any particular network type, protocol, wavelength or data rate however and, more generally, embodiments of the invention can be employed with a wide variety of different network types, protocols, wavelengths and/or data rates.

In some implementations, an example optoelectronic transducer can be employed in an optical communication system, device and/or network having a data rate of up to about 2.5 Gb/s, 10 Gb/s, or higher. Other example optoelectronic transducers may be employed in connection with data rates of 40 Gb/s, 100 Gb/s, or higher. Examples of optical signal wavelengths in connection with which some embodiments of the invention may be employed include, but are not limited to, the nominal wavelengths 850 nm, 1280 nm, 1310 nm, and 1550 nm.

Similarly, some of the example optoelectronic transducers disclosed herein may be employed in connection with a variety of different data transfer protocols. Examples of such protocols include, but are not limited to, Ethernet, Gigabit Ethernet, the various OC-X protocols, SONET, and Fibre Channel. Correspondingly, the modules in connection with which the disclosed example optoelectronic transducers may be employed may conform with any of a variety of MSAs. Such MSAs include, but are not limited to, the GBIC, SFP, SFF and XFP MSAs.

With more particular reference now to certain aspects of at least some embodiments of the invention, such embodiments are configured so as to implement a curved configuration at one or more corners. As contemplated herein, such 'corners' embrace both regions where adjacent edges intersect, such as may occur in a substantially two dimensional structure, as well as regions where adjacent surfaces intersect, such as may occur in a structure that is substantially three dimensional. The following two examples, which should not be construed to limit the scope of the invention in any way, help to further illustrate this notion.

In particular, and for the purposes of illustration only, a single epitaxial layer might be considered to constitute, in certain circumstances, an example of a substantially two dimensional structure having top and bottom surfaces and intersecting edges, but no appreciable side surfaces. Further, a stack of several epitaxial layers might be considered to constitute, in certain circumstances, an example of a substantially three dimensional structure having intersecting side, top and bottom surfaces.

In general, a radius, or other type of curvature, is employed so as to aid in the achievement of a corresponding reduction of the risk that ESD will occur. While a radiused corner may be employed to this end, the scope of the invention is not limited solely to radiused corner geometries. Rather, a corner that defines any other suitable type of curve is contemplated as being within the scope of the invention. By way of example only, such corners may define a curve whose shape is elliptical, parabolic, sinusoidal, cycloidal, exponential, logarithmic, involute, spiral, or whose shape comprises a combination of one or more of the foregoing, or other, example types of curves.

With reference to the particular example of a radiused corner, there is an inverse relationship between the radius of curvature and the strength of an electric field associated with the optoelectronic device that defines the intersection, such that as the radius of curvature at a corner decreases, electric field strength proximate the corner increases. Conversely, electrical field strength proximate the corner decreases as the radius of curvature increases. Thus, the electrical field strength is relatively higher at the 'sharper' corners that have a relatively small radius of curvature. As disclosed elsewhere herein, a relatively higher electrical field strength corresponds to a relatively greater risk that an electrostatic discharge ("ESD") event may occur which can, in turn, lead to damage or failure of the device.

It should be noted that embodiments of the present invention may implement the shaping of a variety of structures not only in the optoelectronic transducers themselves, but in the structures used in the production of such devices by epitaxial, and other, manufacturing and production processes. Examples of surfaces and structures in connection with which such shaping may be employed include, but are not limited to, photosensitive regions, masks, diffusion windows, p-contact layers, n-contact layers, interconnect structures, and mesa profiles. More generally, the shaping of structures may be employed wherever the potential for ESD may be a matter of concern. Further, aspects of example embodiments can be implemented in optical detectors of a variety of different types including, but not limited to, edge, APD and PIN-type optical detectors, and in optical detectors of various material compositions.

Consistent with the foregoing, one, some, or all, layers of an optical detector may implement one or more curved corners such as those disclosed herein. In at least some embodiments, some or all of such optical detector layers are created by one or more epitaxial processes.

Finally, embodiments of the optical detectors may take a variety of shapes. By way of example, some embodiments have a perimeter that includes one or more substantially linear portions. One such embodiment comprises two or more adjoining portions that are each substantially rectangular. Note that as used herein, 'rectangular' embraces square portions. Yet other embodiments have a perimeter that includes one or more curved portions. Still further embodiments have perimeters that include both linear and curved portions. Note that nothing herein should be construed as limiting the scope of the invention to any particular shape or configuration of optical detector, nor as limiting any particular type of detector to any particular shape, or as limiting any particular shape for use with any particular type of detector.

II. Aspects of Some Example Embodiments

Figure 1:
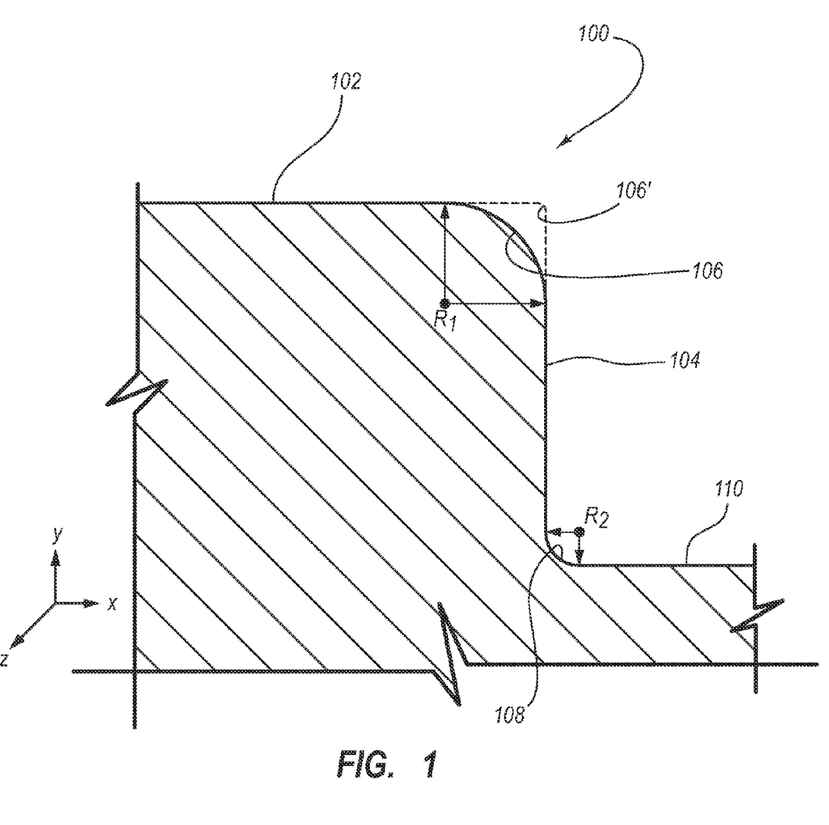
FIG. 1 is a top view of a portion of an example optoelectronic device that includes curved corners.

Reference is first made to FIG. 1, which discloses a structure 100 that includes first and second portions 102 and 104. Depending upon the configuration of the structure 100, the first and second portions 102 and 104 may comprise surfaces or edges. The structure 100 itself may comprise a photosensitive region, diffusion window, mask, contact layer such as a p-contact layer or an n-contact layer, interconnect structure, a mesa profile, or other structure, or portion thereof, or any portion of an optoelectronic transducer in connection with which actual or potential ESD may present concerns. As indicated in FIG. 1, the first and second portions 102 and 104 cooperate to define a corner 106 having a curved configuration. The corner 106 may be formed as part of an epitaxial process. In one particular implementation, the corner 106 is implemented at least in part by diffusion through an etched nitrite layer.

In one alternative approach, the structure 100 may be constructed initially by an epitaxial or other process, with the configuration indicated at 106', and then be subsequently processed, such as by cutting, etching or other shaping process, so as to produce the configuration of the corner 106. It should be noted that surface intersections configured in the manner of the corner 106' may be associated with undesirable ESD effects by virtue of their relatively sharp configuration.

In the example embodiment of FIG. 1, the corner 106 is implemented in a substantially radiused configuration having a radius of curvature $R_1$. In some embodiments of the invention, the radius of curvature of a corner, such as $R_1$ for example, is equal to or greater than about 2 microns and, in some more particular embodiments, the radius of curvature of a corner, such as the radius of curvature $R_1$ for example, is in the range of about 5 microns to about 20 microns. In yet other embodiments, the radius of curvature $R_1$ for example, is in the range of about 2 to about 5 microns. In still further embodiments, the radius of curvature $R_1$ may be greater than about 20 microns. In at least some instances, the implementation of a radius of curvature of about 5 microns has resulted in an approximately five-fold reduction in electric field strength below the electrical field strength that might be experienced where the radius of curvature was in the range of about 1 micron to about 2 microns.

In at least some instances, the particular geometry of a curve described by a corner, such as the radius of the curve for example, is determined largely empirically. This applies both to circular curves, as well as to the other types of curves disclosed herein. In one example of such an empirical process, a starting point radius, such as about 2 microns for example, is implemented in the device. Next, a voltage is applied to the device by way of the device contact layer(s), and the resulting effects observed. This process may continue, with different devices, different radii, other curvatures, different voltages, and/or other parameter changes, until such time as acceptable ESD performance is realized. In yet other cases, the radius, or other curvature, of a corner may be determined in whole or in part by the use of the appropriate relationships and mathematical equations that relate ESD and electrical field strength with a particular curvature.

It should be noted that while in the example embodiment of FIG. 1, the curvature $R_1$ of corner 106 is implemented substantially in a plane such as the x-y plane, the scope of the invention is not limited to such a configuration. That is, and as disclosed elsewhere herein, portions 102 and 104 may comprise, in some embodiments, surfaces that cooperate with each other, and/or with other surfaces, to define one or more corners of various curvatures that is/are not confined to a single plane. In at least some embodiments, compound curved corners, where three or more surfaces intersect, may be defined and implemented in this way.

Moreover, the curvature of corner 106 need not be implemented as a radiused curvature $R_1$ and may, instead, be implemented as any other curved shape, or combination of curved shapes. As well, various types and magnitudes of corner curvatures may be combined within a single embodiment. Likewise, there is no limit to the number of corners, whether surface and/or edge, that may be implemented in any particular structure.

With continued reference to the example embodiment of FIG. 1, embodiments may include curved interior and/or exterior corners. Corner 106 is one example of an exterior corner, while corner 108 is an example of an interior corner, namely, a corner adjacent to portions 104 and 110 in the example of FIG. 1. In this example, corner 108 has a radius of curvature $R_2$ which may or may not be substantially the same as $R_1$. It should be noted that the preceding discussion concerning both corners generally, and corner 106 in particular, is equally germane to corner 108. Further details concerning various ways in which a radius of curvature, or the suitability of another size and configuration of a curve, is determined are disclosed elsewhere herein. Likewise, aspects of embodiments of various production processes are disclosed elsewhere herein.

Figure 2:
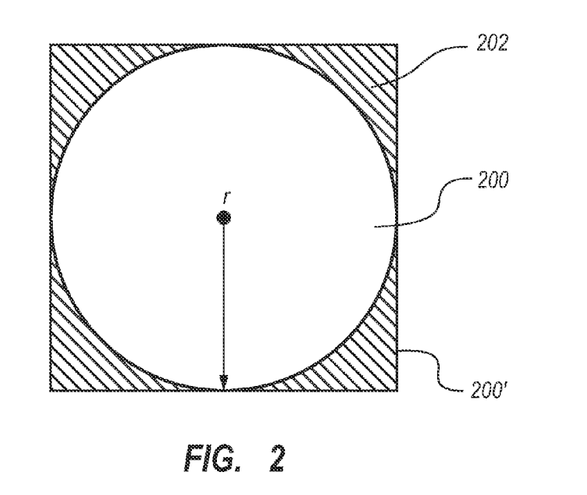
FIG. 2 is a top view of a pair of example optical detectors, illustrating the relative differences in photosensitive areas as between the two different devices.

With reference now to FIG. 2, the incidence of ESD and related destructive effects is associated with relatively sharp corners, as disclosed herein. Thus, one possible approach that might be taken in an attempt to resolve such concerns might be to employ a round optical detector, such as the optical detector 200 indicated in FIG. 2. While such an optical detector 200 is largely devoid of the sharp corners such as might give rise to ESD related concerns, it is likewise apparent that such a geometry represents a significant compromise in terms of the size of the photosensitive area of the optical detector 200. As disclosed below, such a result is problematic.

By way of example, a round optical detector 200 whose diameter is 2 (or radius 'r' of 1) may have a photosensitive area that is about twenty one percent smaller than that of a square having sides that are 2 units long. In particular, for a diameter of 2 units, the area of the round optical photodetector would be $\pi r^2$ or $3.14(1^2)$, or simply 3.14. On the other hand, the photosensitive area of a square optical detector having sides measuring 2 units long would be (2×2) or 4. Dividing 3.14/4 reveals that the photosensitive area of the round optical detector is only about 79% of the size of the photosensitive area of the square optical detector. Thus, while a round optical detector may be somewhat useful in avoiding some ESD effects, that result is only achieved through a relatively large reduction in the photosensitive area of that optical detector.

Inasmuch as an optical detector with a relatively larger photosensitive area is able to more effectively capture optical signals, it is desirable to maximize the photosensitive area to the extent practicable. By way of example, the round optical detector 200 of FIG. 2 would not be able to receive optical signals in any of the corner regions 202 while, in contrast, a comparable square optical detector 200' having sides the same length as the diameter of the round optical detector would be able to do so. Accordingly, at least some embodiments of the invention are directed to optical detectors having one or more portions, such as a perimeter of a photosensitive region or of a contact, for example, that are substantially non-circular. Yet other embodiments, however, are directed to an optical detector having one or more portions that are substantially circular, such as a perimeter of a photosensitive region or of a contact, for example, but that also include one or more linear portions configured and arranged such that one or more curved corners are defined in connection with the one or more linear portions.

Figure 3:
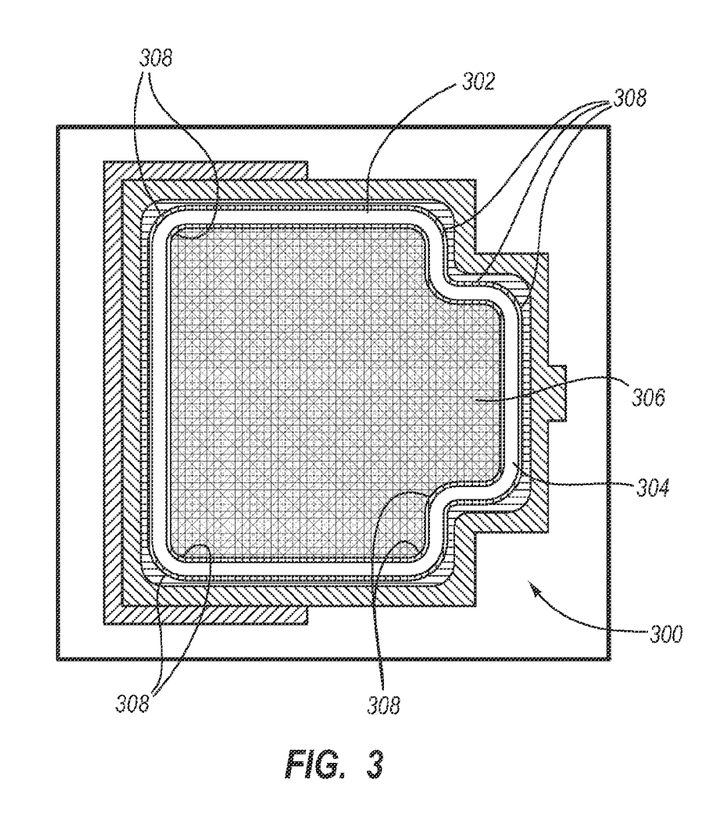
FIG. 3 is a top view of an example of an optical detector that includes various linear edges that terminate in curved corners.
Figure 4:
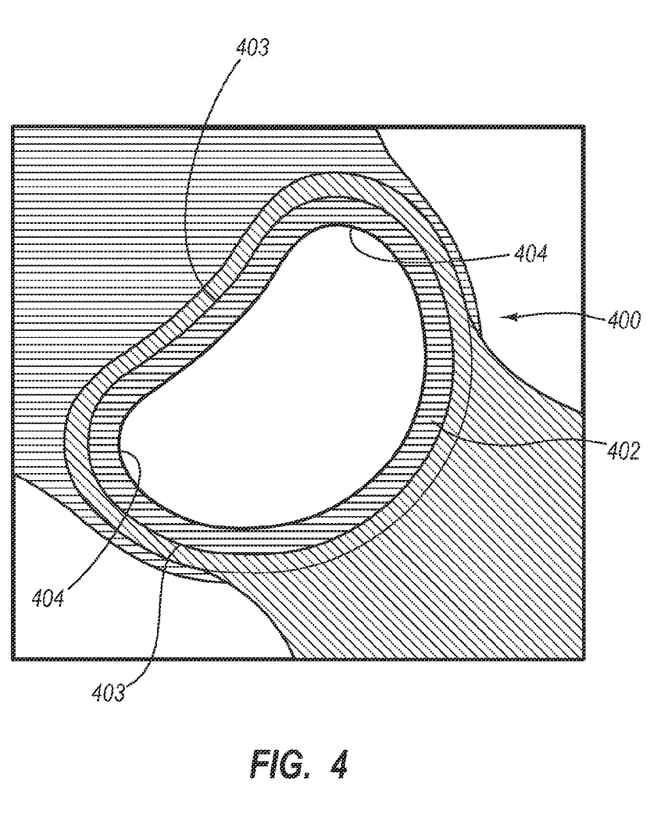
FIG. 4 is a top view of an alternative embodiment of a non-circular optical detector that includes curved edges.

With the foregoing points in mind, attention is directed now to the example embodiments of an optical detector, or photodetector, disclosed in FIGS. 3 and 4. FIG. 3, in particular, discloses an embodiment of a photodetector that comprises an edge-type monitor photodiode ("MPD"), generally depicted at 300. Among other things, such an MPD may be used to monitor the optical output of an optical emitter such as a laser or LED, for example.

The example MPD 300 of FIG. 3 comprises two adjoining portions 302 and 304, each of which has a generally rectangular form, and further includes a photosensitive region 306 that is defined by the adjoining portions 302 and 304. Other embodiments of an MPD or, more generally, an optical detector, are implemented in a single rectangular, or square, portion. Still other embodiments of an optical detector include a plurality of rectangular and/or square portions. With respect to the embodiment of FIG. 3, the configuration and arrangement of the adjoining portions 302 and 304 are such that a plurality of interior and exterior corners 308 are defined at various locations about the perimeter of the photosensitive region 306. In the example of FIG. 3, the corners 308 may be implemented as edge and/or surface intersections.

The corners 308 may each be configured with a desired radius of curvature that is selected and implemented so as to result in a desired local ESD threshold, thus reducing the likelihood of ESD at the corner, and thereby increasing the robustness of the device. In one embodiment, one or more of the corners 308 are implemented so as to result in a local maximum ESD threshold. As disclosed elsewhere herein, it is not necessary that each, or even any, of the corners 308 be radiused. Rather, one or more of the corners 308 may be implemented in any other type of curved configuration.

With attention now to FIG. 4, an example of a P-intrinsic-N ("PIN")-type photodiode ("PD"), denoted generally at 400, is disclosed. In one example embodiment, the PIN PD 400 comprises an InGaAs device, though other semiconductor or other materials may alternatively be employed in this, and other, embodiments of an optical detector disclosed herein. In the disclosed example, the PIN PD 400 includes various layers, one of which is a substantially non-circular p-contact 402 that includes a plurality of curved edges 403 that cooperate to define a plurality of curved corners 404. As disclosed elsewhere herein, one or more of the other layers of the PIN PD 400 may define one or more curved corners. As further noted elsewhere herein, such curved corners may be defined by edges or by surfaces.

In the example embodiment of FIG. 4, one or more of the corners 404 may define a radius of curvature that aids in controlling the electric field strength at the corner 404, thereby reducing the likelihood of damage due to the occurrence of ESD. As disclosed elsewhere herein, one or more of the corners 404 need not be defined by a radius but may, more generally, take the form of other types of curves.

Figure 5:
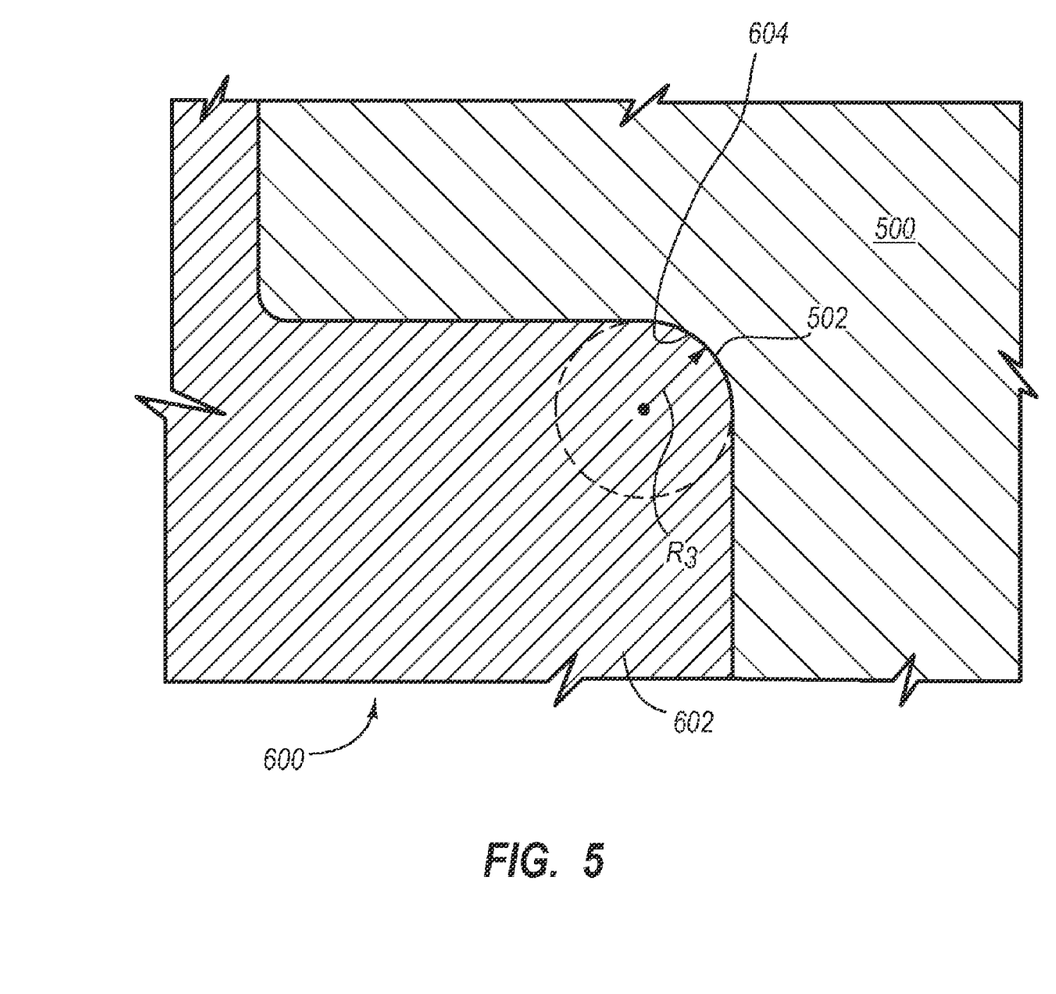
FIG. 5 is a top view of a photosensitive portion of an example optical detector prior to patterning.
Figure 6:
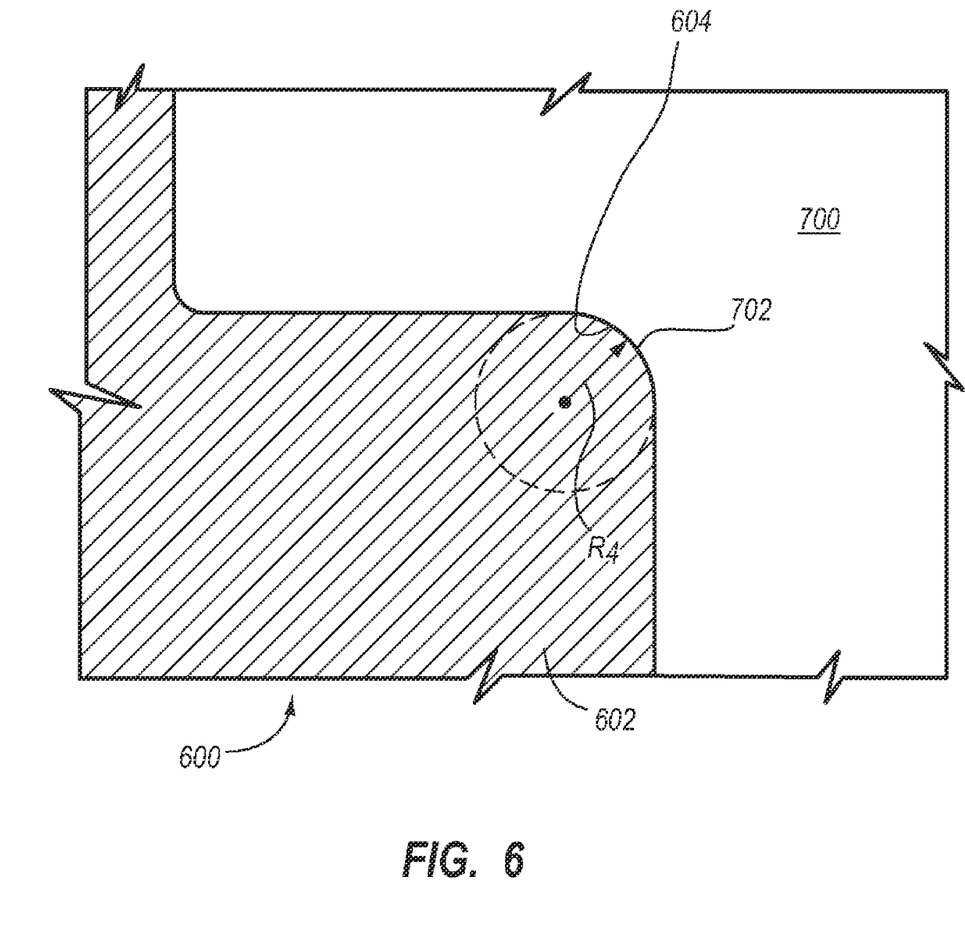
FIG. 6 is a top view of a corner portion of an example of an optical detector after a photoresist mask has been applied and patterned with a photolithography mask.

Reference is now made generally to FIGS. 5 and 6 which disclose various aspects of epitaxial structures configured so as to aid in the control of electrical field strength and, thus, the likelihood of the incidence of damage related to ESD. More particularly, in the example embodiments of FIGS. 5 and 6, the radius of curvature of a corner of the optical detector may be configured to exceed, to a defined extent, the radius that sometimes results from the inherent resolution of processes such as, but not limited to, masking deposition, diffusion, and photolithography.

With particular reference now to the example embodiment of FIG. 5, that figure discloses aspects of a mask 500 and optical detector 600 photosensitive surface 602. In the disclosed example, the interface between the mask 500 and the photosensitive surface 602 is associated with a pair of corners, namely, a corner 604 of the optical detector 600 and a corner 502 of the mask. In this example, corner 604 comprises a curved exterior corner, while corner 502 comprises a curved interior corner. Definition of the corner 502 of the mask 500 and the corner 604 of the optical detector 600 may be performed by etching or any other suitable process(es).

In one example embodiment, the radius of curvature $R_3$ may be in the range of about 5 microns to about 20 microns, though other radii, curvature types and ranges may alternatively be employed, as disclosed herein. Thus, the lower end of this example range is about an order of magnitude larger than the radius of curvature of corners that can result from the inherent resolution of certain epitaxial processes, while the upper end of the foregoing example range is about two orders of magnitude greater than the radius of curvature of corners that may be associated with such epitaxial processes.

Turning now to the example of FIG. 6, an example embodiment is disclosed that includes aspects of the photosensitive surface 602 and an associated photoresist 700. In general, the pattern of the photoresist 700 is affected by the prior placement of the mask 500 (see FIG. 5) such that an interface between the photosensitive surface 602 and the photoresist 700 is associated with a pair of corners, namely, a corner 604 of the optical detector 600 and a corner 702 of the photoresist 700.

In correspondence with the size, shape and orientation of corner 502 defined by the mask 500, the corner 702 of the photoresist 700 is similarly shaped such that it has a relatively large radius of curvature $R_4$ that, in the examples of FIGS. 5 and 6, has about the same magnitude as $R_3$ (see FIG. 5). As disclosed elsewhere herein, one effect of the relatively large radius of curvature of the photosensitive surface 602, as compared with a radius of curvature that may occur as a result of the resolution sometimes associated with optical detector manufacturing techniques, is that the PIN PD 400 is relatively less susceptible to ESD-related damage because the electric field strength is correspondingly lower at locations having a relatively high radius of curvature. Of course, the curved corner 702 is but one example of an implementation of a curved geometry in a structure associated with an optical detector so as to aid in implementing a relative reduction in local electrical field strength, and the scope of the invention is not, accordingly, limited to the example embodiments disclosed herein.

Figure 7:
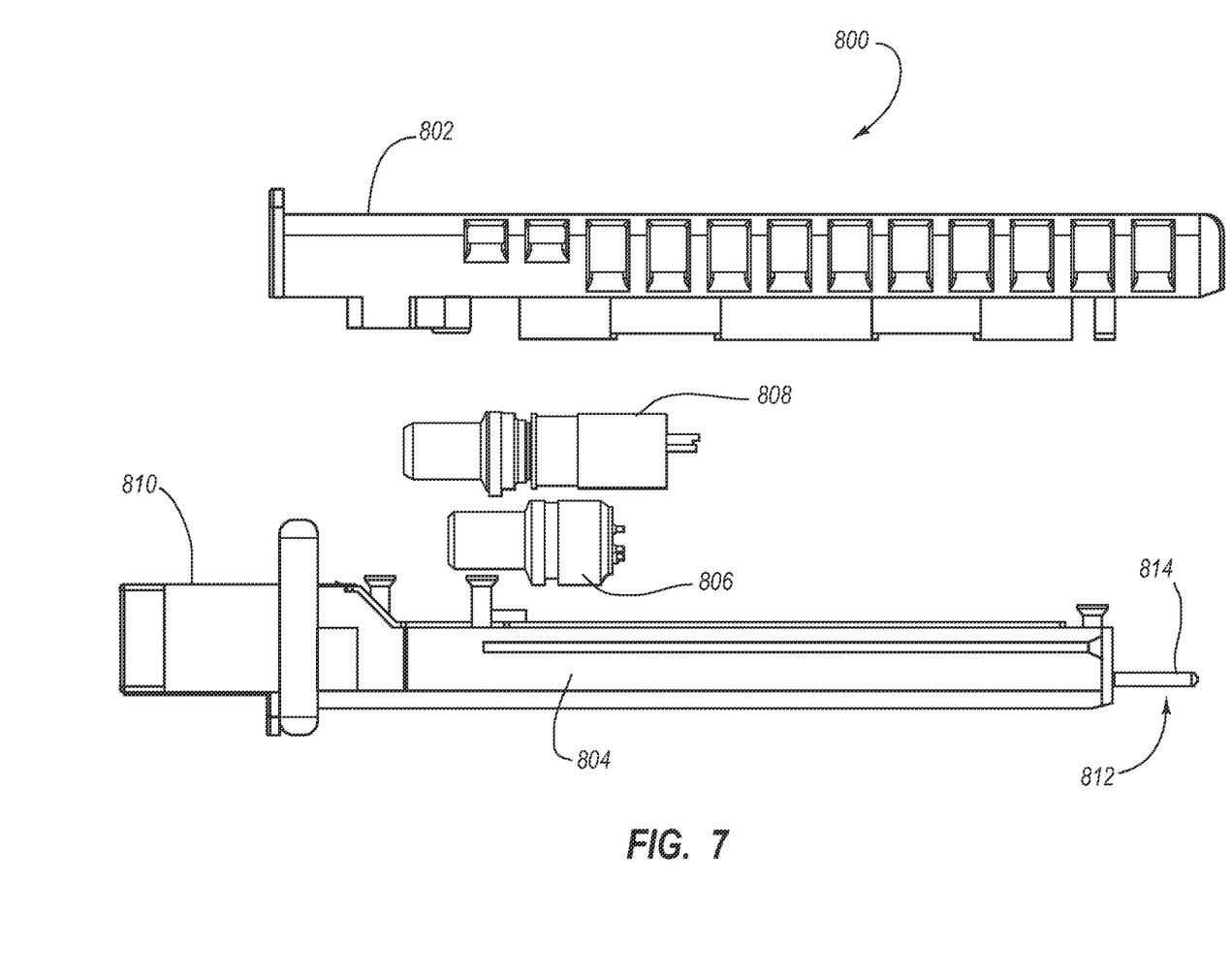
FIG. 7 is a perspective view disclosing aspects of an example environment in which some embodiments of an optical detector may be employed.

Directing attention finally to FIG. 7, details are provided concerning aspects of one example operating environment for some embodiments of the invention. In particular, FIG. 7 is concerned with a module 800, such as an optoelectronic transceiver or transponder module for example. Further examples of modules are disclosed elsewhere herein.

In the disclosed embodiment, the module 800 includes a cover 802 and a shell portion 804 that cooperate to define a housing within which a receiver optical subassembly ("ROSA") 806 and a transmitter optical subassembly ("TOSA") 808 are substantially received. The ROSA 806 and TOSA 808 communicate with an optical communications network by way of an optical cable connector (not shown) that can be removably received within an optical port 810. The ROSA 806 and TOSA 808 are electrically connected to a printed circuit board 812 that includes an edge connector 814 by way of which the ROSA 806 and TOSA 808 are able to communicate with a host device (not shown) with which the module 800 can be physically and electrically connected.

With particular reference to the ROSA 806 and the TOSA 808, each of those devices may include an optical detector such as those disclosed herein. In one example embodiment, the ROSA 806 includes an optical receiver (not shown), examples of which are disclosed herein, that is configured to convert optical data signals to electrical data signals that may be transmitted to a host (not shown). As well, the TOSA 808 may include an MPD, examples of which are disclosed herein, that is configured and arranged to monitor the optical output power of a transmitter (not shown), such as a laser or LED for example, that is included in the TOSA 808. Of course, various other combinations of optical detectors may be used in the module 800, or other operating environments. Accordingly, the scope of the invention is not intended to be limited to the example of FIG. 7.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical detector, comprising:
    a photosensitive layer;
    a first contact layer; and
    a second contact layer, the first and second contact layers being in electrical communication with the photosensitive layer, and one of the layers being shaped so as to define a corner whose radius of curvature is in the range of 5 microns to 20 microns resulting in a reduction in electric field strength below a desired level while maximizing overall size of the layer that is shaped so as to define the corner.

2. An optical subassembly comprising the optical detector as recited in claim 1 and a transmitter, wherein the optical detector comprises a monitor photodiode ("MPD") configured and arranged to monitor the optical output power of the transmitter.

3. The optical detector as recited in claim 1, wherein the layer that is shaped so as to define the corner comprises one of the contact layers.

4. The optical detector as recited in claim 1, wherein the layer that is shaped so as to define the corner comprises the photosensitive layer.

5. The optical detector as recited in claim 1, further comprising first and second surfaces, wherein the corner joins the first and second surfaces of the optical detector.

6. The optical detector as recited in claim 1, further comprising first and second surfaces, wherein the corner joins the first and second surfaces of the optical detector.

7. An optical detector, comprising:
    a photosensitive layer;
    a first contact layer; and
    a second contact layer, the first and second contact layers being in electrical communication with the photosensitive layer, and at least one of the layers having a substantially non-circular shape that is substantially free of linear portions and that includes a plurality of corners, none of which has a radius of curvature of less than two microns so as to maximize the overall size of the layer while reducing below a desired level an electrical field strength effect proximate to any corner of the at least one layer.

8. The optical detector as recited in claim 7, wherein each of at least one of the corners is connected to first and second curved portions of the substantially non-circular shape.

9. The optical detector as recited in claim 7, wherein each of at least one of the corners has a radius of curvature greater than 5 microns.

10. The optical detector as recited in claim 7, wherein each of at least one of the corners defines a non-circular arc.

11. A method for manufacturing an optical detector, comprising:
   producing a photosensitive layer;
   producing a first contact layer;
   producing a second contact layer, the first and second contact layers being in electrical communication with the photosensitive layer,
   wherein at least one of the contact layers defines a substantially non-circular shape having a curvature at a corner, and
   wherein the shape and magnitude of the curvature of the corner are determined based on a predetermined electrical field strength effect exhibited thereby.

12. The method according to claim 11, wherein the radius of the curvature is at least five micron resulting in a reduction in electric field strength below the electrical field strength of a radius of curvature of about one or two micron.

13. A according to claim 11, wherein the shape of the intersection is not entirely round so as to increase surface area of the photosensitive area while reducing the electrical field strength due to a lack of sharp corners.

14. The optical detector as recited in claim 11, wherein the corner is connected to first and second curved portions of a substantially non-circular shape.

15. The optical detector as recited in claim 11, wherein each of the intersecting layers has top and bottom surfaces but no appreciable side surfaces.

* * * * *